United States Patent
Janssen

(10) Patent No.: US 11,446,927 B2
(45) Date of Patent: Sep. 20, 2022

(54) METHOD OF BONDING PRINTED CIRCUIT SHEETS

(71) Applicant: Canon Production Printing Holding B.V., Venlo (NL)

(72) Inventor: Peter J. M. Janssen, Venlo (NL)

(73) Assignee: CANON PRODUCTION PRINTING HOLDING B.V., Venlo (NL)

( * ) Notice: Subject to any disclaimer, the term of this patent is extended or adjusted under 35 U.S.C. 154(b) by 149 days.

(21) Appl. No.: 16/853,125

(22) Filed: Apr. 20, 2020

(65) Prior Publication Data

US 2020/0346455 A1    Nov. 5, 2020

(30) Foreign Application Priority Data

May 3, 2019 (EP) .................................... 19172538

(51) Int. Cl.
 *B41J 2/14* (2006.01)
 *B41J 2/16* (2006.01)
 *H05K 1/02* (2006.01)
 *H05K 3/46* (2006.01)

(52) U.S. Cl.
 CPC ......... *B41J 2/14201* (2013.01); *B41J 2/1607* (2013.01); *B41J 2/1623* (2013.01); *H05K 1/0277* (2013.01); *H05K 3/4644* (2013.01); *B41J 2002/14491* (2013.01); *H05K 2201/09236* (2013.01)

(58) Field of Classification Search
 CPC .... B41J 2/14201; B41J 2/1607; B41J 2/1623; B41J 2002/14491; H05K 1/0277; H05K 3/4644; H05K 2201/09236; H05K 3/323; H05K 2201/09781; H05K 2203/0278; H05K 3/361
 See application file for complete search history.

(56) References Cited

U.S. PATENT DOCUMENTS

2002/0012096 A1    1/2002  Uchiyama

FOREIGN PATENT DOCUMENTS

| EP | 2229041 A1 * | 9/2010 | ............. H05K 3/323 |
| JP | 10-301128 A | 11/1998 | |
| JP | 2000246893 A * | 9/2000 | |

OTHER PUBLICATIONS

IP.com search (Year: 2022).*
European Search Report, issued in EP Application No. 19 17 2538, dated Nov. 7, 2019.

* cited by examiner

*Primary Examiner* — Lisa Solomon
(74) *Attorney, Agent, or Firm* — Birch, Stewart, Kolasch & Birch, LLP

(57) ABSTRACT

A method of bonding printed circuit sheets to one another, each of the printed circuit sheets having a pattern of electrically conductive tracks, and the bonding being carried out by applying an adhesive to one of the sheets in a connection zone where the tracks on the one sheet are to be connected to corresponding tracks on the other sheet, superposing the sheets in the connection zone such that the adhesive is sandwiched between the sheets, and aligning the sheets such that corresponding tracks on the two sheets are aligned with one another. The method includes a preparatory step of forming extra tracks on the two sheets such that, in the alignment and compression steps, the extra tracks are brought into engagement with one another and constitute a barrier for the adhesive.

17 Claims, 2 Drawing Sheets

METHOD OF BONDING PRINTED CIRCUIT SHEETS

The invention relates to a method of assembling a print head assembly which comprises bonding flexible printed circuit sheets to one another, each of the printed circuit sheets having a pattern of electrically conductive tracks, and the bonding being carried out by applying an adhesive to one of the sheets in a connection zone where the tracks on the one sheet are to be connected to corresponding tracks on the other sheet, superposing the sheets in the connection zone such that the adhesive is sandwiched between the sheets, aligning the sheets such that corresponding tracks on the two sheets are aligned with one another, and compressing the sandwich formed by the sheets and the adhesive.

Connection strips that are obtained by bonding two printed circuit sheets together by means of the method described above are utilized for example in ink jet printers for establishing electrical connections between actuators in a print head and electronic control elements that provide control signals for these actuators. Typically, the print head has an array of nozzles which are arranged at very narrow spacings, e.g. with a spacing of only 42 μm from nozzle to nozzle, and each of these nozzles has its own actuator that must be controlled individually. Consequently, the electrically conductive tracks on the printed circuit sheet contacting these actuators will also be arranged at narrow spacings.

In the process of manufacturing the print head, a printed circuit sheet, e.g. a Flexible Printed Circuit (FPC) is attached to the print head such that each track contacts one of the actuators. An electronic controller for the print head is usually manufactured separately from the print head, and another printed circuit sheet or FPC is attached to the controller so as to contact the individual control elements of the controller. The controller for example may be in the form of an ASIC, which is mounted on its respective flexible printed circuit sheet. Then, in order to connect the print head to the controller, the printed circuit sheet attached to the print head is bonded to the circuit sheet attached to the controller by means of the method described above, so that each actuator of the print head is electrically connected to its individual control element.

The connection strip comprising the two bonded printed circuit sheets is then subject to further processing such as applying a coating or sheath for protecting the connection strip against all kinds of external influences.

It has been observed that the connection strips obtained after the further processing show certain defects, so that the protection of the electronic circuitry is incomplete.

It is an object of the invention to provide a bonding method for forming print head assemblies that can reduce the occurrence of defects in the resulting connection strips.

In order to achieve this object, the method according to the invention is characterized by a preparatory step of forming extra tracks on the two sheets such that, in the alignment and compression steps, the extra tracks are brought into engagement with one another and constitute a barrier for the adhesive.

When, in the conventional method, the sandwich of the printed circuit sheets and the adhesive is compressed in order to bond the two sheets together, part of the adhesive may be squeezed out and may contaminate certain sites on the outside of the connection strip, which compromises the later processing steps. In the method according to the invention, the barrier that is formed by the extra tracks on the printed circuit sheets can stop the flow of adhesive to the outside, so that the later processing steps can be performed correctly and without leading to any defects.

More specific optional features of the invention are indicated in the dependent claims.

The electrically conductive tracks on the two printed circuit sheets to be bonded together will typically extend in parallel to one another in a longitudinal direction of the connection strip to be formed. Then, the extra tracks may be formed such that they extend in parallel with the electrically conductive tracks on both sides of the array of these tracks, i.e. along both the longitudinal edges of the connection area. In this way, the adhesive can reliably be prevented from being squeezed out at the opposite longitudinal edges of the connecting strip.

The extra tracks may be formed of the same electrically conductive material as the tracks that serve for contacting the actuators and control elements and may also have the same shape and thickness as the regular tracks.

In other embodiments, the shape or the width of the extra tracks may be different from that of the regular tracks. For example, the extra tracks may have a larger width, so that they can be brought into engagement with one another more reliably in order to constitute a safe and tight barrier.

On the other hand, it is not mandatory that the extra tracks are also made of an electrically conductive material. An insulating material might as well be used for forming these tracks.

In the longitudinal direction of the connection strip, i.e. the direction in which the tracks extend, a leakage of the adhesive to the outside may be prevented for example by making the length of the area of overlap between the two printed circuit sheets significantly larger than the length of the area where the adhesive is applied. If desired, it is possible however to provide extra tracks (in this case preferably made from an insulating material) along the boundaries of the connection area that extend in transverse direction of the connection strip.

The invention also relates to an inkjet print head assembly 10. comprising a plurality of actuators, each of which is configured for applying a pressure pulse to a pressure chamber for ejecting a droplet of fluid from a nozzle in response to a control signal transmitted to the respective actuator, comprising a first printed circuit sheet comprising a pattern of electrically conductive tracks connected at one end to the plurality of actuators and a second printed circuit sheet bonded by an adhesive to the first printed circuit and comprising a pattern of electrically conductive tracks in electrical connection with respective ones of the pattern of electrically conductive tracks of the first printed circuit board, wherein each of the first and second printed circuit sheets comprises the extra tracks brought into engagement with one another and constitute a barrier for the adhesive, which extra tracks are not connected to the plurality of actuators and/or the controller. The first and second printed circuit sheets are preferably flexible first and second printed circuit sheets (FPC).

In an embodiment, the electronic controller is mounted on the second printed circuit sheet. A suitable controller may be provided in the form of an ASIC unit. The controller on one end is connected to and receives control information from a print processor of the printer. Said control information is processed into control signal signals and transmitted to the respective actuators via the electrical tracks. An electrical track of the first printed board is electrically connected to one of the actuators as well as to a corresponding electrical track of the second printed circuit sheet. Thereby the controller is in electrical connection to the plurality of actuators.

This applies to at least each electrical track designated for transmitting a control signal or driving pulse to an actuator. Additional tracks for shared or common voltages, such as a common ground, may further be provided on the printed circuit sheets. The extra tracks however do not provide an electrical connection between the controller and the actuators. Preferably, the extra tracks on the first printed circuit sheet terminate at least on at the actuator side without an electrical connection at said side.

In an embodiment, the print head is formed of stacked silicon substrates and the first printed circuit sheet is bonded to one of the substrates. The print head is preferably manufactured by MEMS processing by selective etching of silicon substrates. Thereby, a flow path comprising the pressure chamber as well as a cavity for the actuator are formed in different silicon substrates, which substrates are mounted onto one another to form the print head. One of the substrates is provided with contact pads to which the electrical tracks of the first printed circuit sheet are bonded. Preferably, the end of the extra tracks on the actuator side of the first printed circuit sheet are isolated from the contact pads and thus from the actuators.

Embodiment examples will now be described in conjunction with the drawings, wherein.

Figure 1:
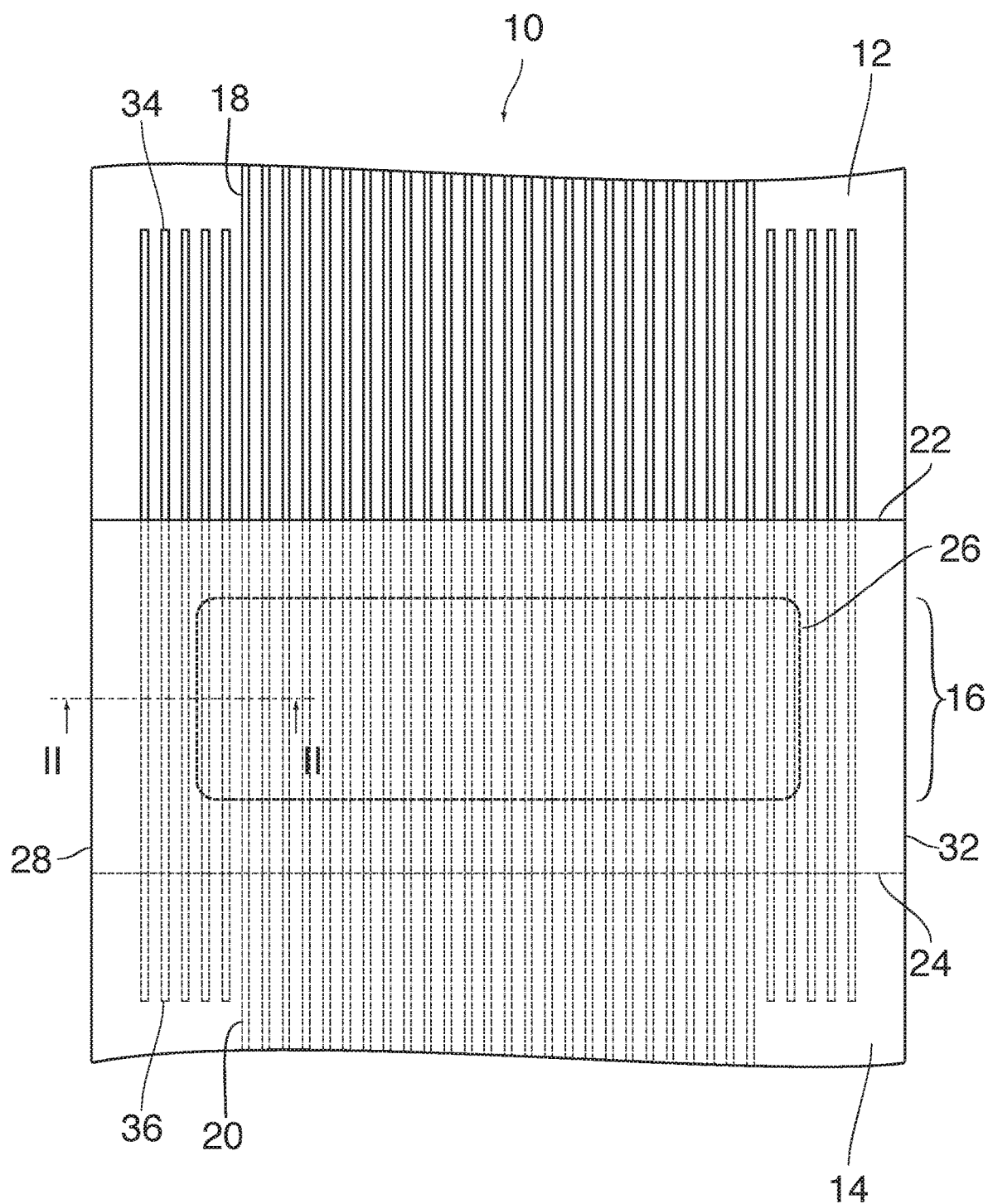
FIG. 1 is a plan view of a part of a connection strip in which two printed circuit sheets have been bonded together.

As is shown in FIG. 1, a connection strip 10 which may be used for example for connecting a print head of an ink jet printer to an electronic controller comprises two printed circuit sheets 12, 14 that are bonded together in a connection zone 16. The printed circuit sheets 12, which may for example be connected to the print head, carries on one of its main surfaces, the surface that is visible in FIG. 1, a pattern of parallel electrically conductive tracks 18 each of which serves for contacting an actuator, e.g. a piezoelectric transducer, for a single nozzle of the print head. It will be understood that the number of nozzles and, hence, the number of actuators of a high-resolution ink jet printer is considerably larger than the number of tracks 18 shown in FIG. 1, so that, in a practical embodiment, a number of tracks must be considered to be significantly larger than in the example given here.

In the example shown, the tracks 18 are arranged with equal spacings and extend in parallel to one another in a longitudinal direction of the connection strip 10.

The other printed circuit sheet 14 carries on one of its surfaces, the surface that is facing away from the viewer in FIG. 1, a corresponding number of electrically conductive tracks 20. The sheet 14 has been superposed on the sheet 12 such that both sheets overlap in a zone ranging from the top edge 22 of the sheet 14 to a bottom edge 24 of the sheet 12 (the terms "top" and "bottom" relate only to the representation shown in FIG. 1 and are not related to the orientation in which the connection strip is arranged in the printer).

Figure 2:
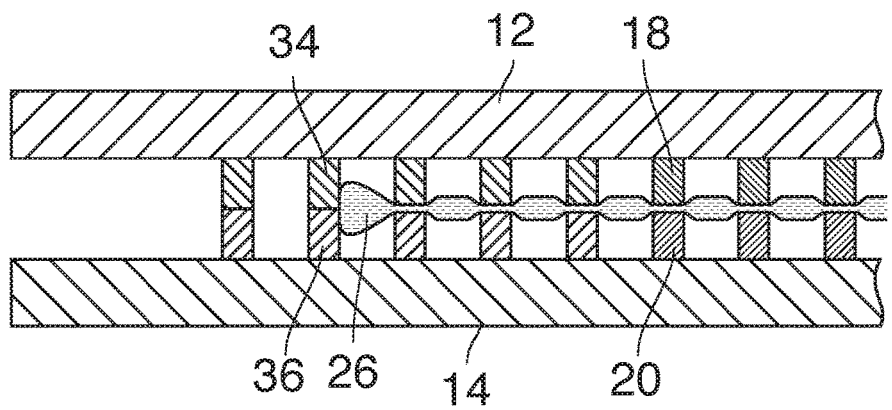
FIG. 2 is an enlarged cross-sectional view taken along the line II-II in FIG. 1.

The two sheets 12 and 14 have been aligned such that, in the zone of overlap between the edges 22 and 24, the tracks 18 and 20 are perfectly aligned with one another, so that each track 18 matches a corresponding one of the tracks 20. In FIGS. 1 and 2 the tracks 18, 20 are illustrated as having a similar or the same width. The width of the tracks 18, 20 may in practice vary with respect to one another, for example dependent on the function of the respective tracks 18, 20 or the current and/or voltage to be applied thereto. Further, the track width may be varied to ease the alignment process, for example by forming a corresponding pair of tracks 18, 20 of the different sheets 12, 14 as a narrow track 18 on the first sheet 12 and a wide track 20 on the second sheet 14. As such, the present invention is compatible with any width track variation available to the skilled person.

In the connection zone 16, a layer or patch of an adhesive 26 has been applied to one of the sheets, e.g. the sheet 12, so as to cover the entire width of the array of the tracks 18. As is well known in the art, the adhesive 26 may be an ACF-type adhesive (Anisotropic Conductive Film) which has a high conductivity only in the direction normal to the plane of the drawing in FIG. 1, the conductivity being especially high when the conductive film is compressed, whereas the film behaves essentially as an insulator in the transverse direction of the tracks 18 and 20. Thus, when the sheets 12 and 14 with the adhesive 26 interposed therebetween are compressed in the zone of overlap, the adhesive 26 will not only bond the two sheets together but will also form electric contacts with low resistance between each pair of matching tracks 18 and 20, whereas each of these pairs will be insulated from the neighboring pairs.

A problem of the bonding method that has been described so far is that the adhesive 26, when compressed, may be squeezed out at the lateral edges 28 and 32 of the connection strip. The adhesive that leaks out from the joint between the superposed sheets 12 and 14 may compromise later processing steps in which, for example, the connection strip 10 is coated with a protective material. In order to avoid such a leakage of the adhesive 26, it would be necessary to leave wide safety margins on both sides of the arrays of tracks 18 and 20, which would however increase the overall width of the connection strip.

In order to safely prevent the leakage of adhesive 26 without having to substantially increase the width of the connection strip, a number of extra tracks 34 and 36 have been formed on both sheets 12, 14 on both sides of the arrays of tracks 18 and 20. In the example shown, the extra tracks 34 have the same width and the same spacing (and the same thickness) as the conductive tracks 18, and the extra tracks 36 of the sheet 14 have the same width and spacing (and thickness) as the conductive tracks 20. However, the tracks 34 are not connected to any actuators of the print head, and the tracks 36 are not connected to any components of the controller. Consequently, the extra tracks 34 and 36 do not have to be made of an electrically conductive material. Instead, the function of the extra tracks 34 and 36 is only to form a barrier that prevents the leakage of the adhesive 26.

When the sheets 12 and 14 are compressed in the bonding process, each extra track 36 will be firmly pressed against the mating track 34, so that both tracks together form a tight barrier that the adhesive 26 cannot overcome, even when it is being squeezed. When the pressure is released at the end of the compression step, the sheets 12 and 14 remain bonded together. The thickness of the layer of adhesive between each pair of tracks 18 and 20 has been reduced due to the squeezing, but the layer thickness is sufficient for electrically connecting the tracks and firmly holding them together. Consequently, at least the pair of extra tracks 34 and 36 immediately adjacent to the boundary of the patch of adhesive 26 continues to be firmly held together, so that they still constitute an effective barrier against the leakage of adhesive.

In principle, a single pair of extra tracks 34 and 36 on each side of the connection zone would be sufficient. Nevertheless, in the example shown, a larger number (5) of extra tracks 34 and 36 has been provided on either side. This has the advantage that there is an increased working latitude for applying the layer of adhesive 26. Given the small distance between adjacent tracks, it would otherwise be difficult to determine with sufficient accuracy the lateral boundaries of the area where the adhesive is applied.

FIG. 2 is an enlarged cross-sectional view illustrating how the pairs of extra tracks 34 and 36 (at least those outside of the area where the adhesive 26 has been applied) constitute an effective barrier against the adhesive 26. The conductive tracks 18 and 20 have been shown in FIG. 2 with a different type of hatching in order to distinguish them from the extra tracks 34 and 36.

In a practical embodiment, the thickness of the tracks 34 and 36 (i.e. the height by which the protrude from the surface of the sheet) may be equal to the thickness of the electrically conductive tracks 18 and 20. It is possible however to make the thickness of the extra tracks 34 and 36 slightly larger, so that these extra tracks can still be in engagement with one another even if a thicker layer of adhesive 26 remains between the conductive tracks 18 and 20.

Figure 3:
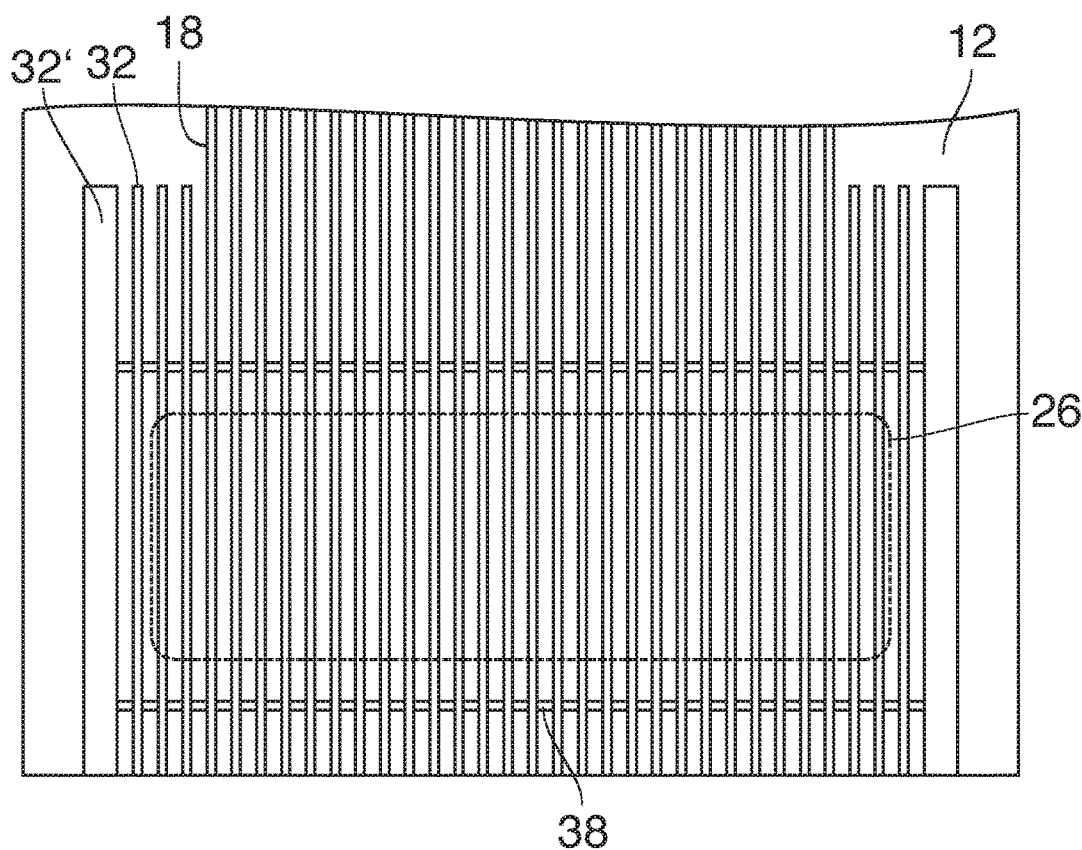
FIG. 3 is a top plan view of an end of a printed circuit sheet configured for a bonding method according a modified embodiment.

FIG. 3 shows a printed circuit sheet 12 of a connection strip according to another embodiment. Here, the extra tracks 32 comprise tracks 32' that differ in shape from the regular conductive tracks 18. In the example shown, the extra tracks 32' have a larger width. Although not shown in the drawings, the extra tracks 36 of the sheet 14 also comprise extra tracks with a larger width, these tracks being arranged opposite to the extra tracks 32', so that the sheets can more easily be aligned such that there is a substantial area in which the extra tracks are in engagement with one another. In the example shown in FIG. 3, there are also provided extra tracks 38 that extend in transverse direction of the connection strip and delimit the connection zone that contains the adhesive 26 in longitudinal direction. The extra tracks 38 have the same thickness as the regular tracks 18 and the extra tracks 32 and 32' and fill the gaps between the tracks 18, that extend in longitudinal direction, so that the top surfaces of all tracks and extra tracks are level with one another. Corresponding extra tracks are also provided on the sheet 14, so that, when the sheets are bonded to one another, the extra tracks 38 form a barrier that prevents leakage of the adhesive 26 in longitudinal direction. In order to prevent short circuits between the conductive tracks 18, the extra tracks 38 should be electrically insulating. For example, the extra tracks 38 may be formed of ACF.

Figure 4:
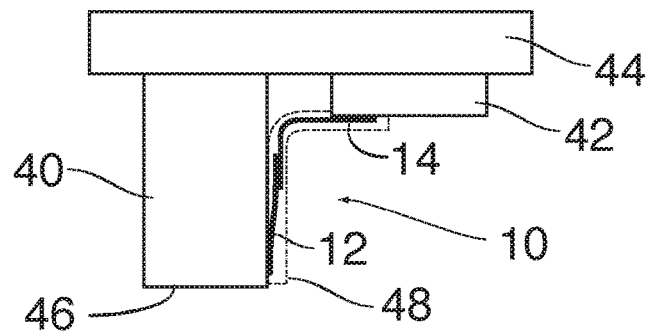
FIG. 4 is a schematic view of an ink jet printer having a connection strip according to the invention.

FIG. 4 is a simplified view of an ink jet printer having a print head 40 and an electronic controller 42 mounted on a common carriage 14. The print head 40 has a nozzle face 46 with a linear array of nozzles that extend in the direction normal to the plane of the drawing in FIG. 4. Each nozzle has an actuator that is electrically connected to a control element in the controller 42. The electrical connection is achieved by the connection strip 10 shown in FIG. 1, for example. The sheets 12 and 14 are bonded together as described above and are jointly encapsulated in a protective coating 48.

The invention claimed is:

1. An inkjet print head assembly comprising:
a plurality of actuators, each of the plurality of actuators being configured for applying a pressure pulse to a pressure chamber for ejecting a droplet of fluid from a nozzle in response to a control signal transmitted from a controller to a respective of the plurality of actuators;
a first printed circuit sheet comprising a pattern of electrically conductive tracks connected at one end to the plurality of actuators; and
a second printed circuit sheet bonded by an adhesive to the first printed circuit and comprising a pattern of electrically conductive tracks in electrical connection with respective ones of the pattern of electrically conductive tracks of the first printed circuit board,
wherein each of the first and second printed circuit sheets comprises extra tracks brought into engagement with one another and constituting a barrier for the adhesive, and
wherein the extra tracks are not connected to the plurality of actuators and/or the controller.

2. A method of assembling the print head assembly according to claim 1, comprising:
bonding the first flexible printed circuit sheet to the second printed circuit sheet, the bonding being carried out by applying an adhesive to one of the sheets in a connection zone where the tracks on the one sheet are to be connected to corresponding tracks on the other sheet;
superposing the sheets in the connection zone such that the adhesive is sandwiched between the sheets;
aligning the sheets such that corresponding tracks on the two sheets are aligned with one another; and
compressing the sandwich formed by the sheets and the adhesive,
wherein the extra tracks act as a barrier to the adhesive.

3. The method according to claim 2, wherein an electronic controller is mounted on one of the flexible print circuit sheets.

4. The method according to claim 2, wherein the electrically conductive tracks are arranged in parallel to one another and extend in a longitudinal direction of a connection strip constituted by the printed circuit sheets bonded together, and the extra tracks extend parallel with the conductive tracks and are arranged to delimit the connection zone in a transverse direction of the connection strip.

5. The method according to claim 4, wherein the conductive tracks and the extra tracks are arranged at regular spacings and have the same width.

6. The method according to claim 2, wherein the extra tracks are made of an electrically conductive material.

7. The method according to claim 2, wherein the extra tracks have a height that is identical with a height of the conductive tracks.

8. A print head comprising two flexible printed circuit sheets bonded together by the method according to claim 2.

9. A method of assembling the print head assembly according to claim 1, comprising:
bonding the first flexible printed circuit sheet to the second printed circuit sheet, the bonding being carried out by applying an adhesive to one of the sheets in a connection zone where the tracks on the one sheet are to be connected to corresponding tracks on the other sheet;
superposing the sheets in the connection zone such that the adhesive is sandwiched between the sheets;
aligning the sheets such that corresponding tracks on the two sheets are aligned with one another; and
compressing the sandwich formed by the sheets and the adhesive,
wherein the electrically conductive tracks are arranged in parallel to one another and extend in a longitudinal direction of a connection strip constituted by the printed circuit sheets bonded together, and the extra tracks extend parallel with the conductive tracks and are arranged to delimit the connection zone in a transverse direction of the connection strip, and wherein the extra tracks comprise tracks which have a larger width than the conductive tracks.

10. A method of assembling the print head assembly according to claim 1, comprising:

bonding the first flexible printed circuit sheet to the second printed circuit sheet, the bonding being carried out by applying an adhesive to one of the sheets in a connection zone where the tracks on the one sheet are to be connected to corresponding tracks on the other sheet;

superposing the sheets in the connection zone such that the adhesive is sandwiched between the sheets;

aligning the sheets such that corresponding tracks on the two sheets are aligned with one another; and compressing the sandwich formed by the sheets and the adhesive, wherein the electrically conductive tracks are arranged in parallel to one another and extend in a longitudinal direction of a connection strip constituted by the printed circuit sheets bonded together, and the extra tracks extend parallel with the conductive tracks and are arranged to delimit the connection zone in a transverse direction of the connection strip, and wherein the extra tracks comprise tracks that extend in transverse direction of the connection strip and delimit the connection zone in a longitudinal direction.

11. The print head assembly according to claim 1, wherein the first and second printed circuit sheets are flexible first and second printed circuit sheets.

12. The print head assembly according to claim 11, wherein the extra tracks are formed extending in parallel with the electrically conductive tracks on both sides of an array of the electrically conductive tracks.

13. The print head assembly according to claim 11, wherein the extra tracks are formed of the same electrically conductive material as the electrically conductive tracks for the first and second printed circuit sheets, respectively.

14. The print head assembly according to claim 11, wherein the adhesive is formed by an anisotropic conductive film.

15. The print head assembly according to claim 11, wherein the actuator is a piezoelectric transducer.

16. An inkjet print head assembly comprising:

a plurality of actuators, each of the plurality of actuators being configured for applying a pressure pulse to a pressure chamber for ejecting a droplet of fluid from a nozzle in response to a control signal transmitted from a controller to a respective of the plurality of actuators;

a first printed circuit sheet comprising a pattern of electrically conductive tracks connected at one end to the plurality of actuators; and a second printed circuit sheet bonded by an adhesive to the first printed circuit and comprising a pattern of electrically conductive tracks in electrical connection with respective ones of the pattern of electrically conductive tracks of the first printed circuit board, wherein each of the first and second printed circuit sheets comprises extra tracks brought into engagement with one another and constituting a barrier for the adhesive, wherein the extra tracks are not connected to the plurality of actuators and/or the controller, wherein the first and second printed circuit sheets are flexible first and second printed circuit sheets, and wherein the controller is mounted on the second printed circuit sheet.

17. An inkjet print head assembly comprising:

a plurality of actuators, each of the plurality of actuators being configured for applying a pressure pulse to a pressure chamber for ejecting a droplet of fluid from a nozzle in response to a control signal transmitted from a controller to a respective of the plurality of actuators;

a first printed circuit sheet comprising a pattern of electrically conductive tracks connected at one end to the plurality of actuators; and a second printed circuit sheet bonded by an adhesive to the first printed circuit and comprising a pattern of electrically conductive tracks in electrical connection with respective ones of the pattern of electrically conductive tracks of the first printed circuit board, wherein each of the first and second printed circuit sheets comprises extra tracks brought into engagement with one another and constituting a barrier for the adhesive, wherein the extra tracks are not connected to the plurality of actuators and/or the controller, wherein the first and second printed circuit sheets are flexible first and second printed circuit sheets, and wherein the print head is formed of stacked silicon substrates and the first printed circuit sheet is bonded to one of the substrates.

\* \* \* \* \*